(12) United States Patent
Matsui et al.

(10) Patent No.: US 9,359,533 B2
(45) Date of Patent: Jun. 7, 2016

(54) CURABLE COMPOSITION, CURED PRODUCT, AND METHOD FOR USING CURABLE COMPOSITION

(71) Applicant: LINTEC CORPORATION, Tokyo (JP)

(72) Inventors: Masami Matsui, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/387,142

(22) PCT Filed: Mar. 22, 2013

(86) PCT No.: PCT/JP2013/058301
§ 371 (c)(1),
(2) Date: Sep. 22, 2014

(87) PCT Pub. No.: WO2013/141360
PCT Pub. Date: Sep. 26, 2013

(65) Prior Publication Data
US 2015/0065663 A1     Mar. 5, 2015

(30) Foreign Application Priority Data

Mar. 23, 2012 (JP) ................. 2012-067245
Sep. 27, 2012 (JP) ................. 2012-213417

(51) Int. Cl.
| | |
|---|---|
| *C09J 183/08* | (2006.01) |
| *C09J 11/06* | (2006.01) |
| *C08K 5/544* | (2006.01) |
| *C08L 83/08* | (2006.01) |
| *H01L 23/29* | (2006.01) |
| *C08G 77/26* | (2006.01) |
| *C09J 183/04* | (2006.01) |
| *G02B 1/04* | (2006.01) |
| *C08G 77/14* | (2006.01) |
| *C08G 77/24* | (2006.01) |
| *C09J 183/06* | (2006.01) |
| *C08G 77/00* | (2006.01) |
| *H01L 33/56* | (2010.01) |

(52) U.S. Cl.
CPC .............. *C09J 11/06* (2013.01); *C08G 77/14* (2013.01); *C08G 77/24* (2013.01); *C08G 77/26* (2013.01); *C08G 77/80* (2013.01); *C08K 5/544* (2013.01); *C08K 5/5442* (2013.01); *C08L 83/08* (2013.01); *C09J 183/04* (2013.01); *C09J 183/06* (2013.01); *C09J 183/08* (2013.01); *G02B 1/04* (2013.01); *H01L 23/296* (2013.01); *H01L 33/56* (2013.01); *H01L 2924/0002* (2013.01)

(58) Field of Classification Search
CPC ......... C09J 11/06; C09J 183/08; C08K 5/544; C08L 83/08
See application file for complete search history.

(56) References Cited

U.S. PATENT DOCUMENTS

| | | | |
|---|---|---|---|
| 5,717,009 A | 2/1998 | Matsushita et al. | |
| 2005/0288415 A1 | 12/2005 | Beers et al. | |
| 2009/0005530 A1 | 1/2009 | Kashio | |
| 2010/0178521 A1 | 7/2010 | Byrne et al. | |
| 2010/0196822 A1* | 8/2010 | Sasaki et al. | 430/280.1 |
| 2010/0243624 A1* | 9/2010 | Yoshida et al. | 219/121.69 |
| 2011/0034659 A1 | 2/2011 | Kashio et al. | |
| 2011/0054139 A1* | 3/2011 | Kashio et al. | 528/33 |
| 2011/0172349 A1* | 7/2011 | Ito et al. | 524/529 |
| 2011/0257315 A1* | 10/2011 | Shiono et al. | 524/266 |

FOREIGN PATENT DOCUMENTS

| | | |
|---|---|---|
| EP | 2 119 745 A1 | 11/2009 |
| JP | 7-309927 A | 11/1995 |
| JP | 2004-359933 A | 12/2004 |
| JP | 2005-263869 A | 9/2005 |
| JP | 2006-328231 A | 12/2006 |
| JP | 2009-1752 A | 1/2009 |
| JP | 2010-065161 A | 3/2010 |
| JP | 2010-152302 A | 7/2010 |
| JP | 2011-2517 A | 1/2011 |
| JP | 2012-37866 A | 2/2012 |
| JP | 2012-155200 A | 8/2012 |
| WO | WO 2011/111667 A1 | 9/2011 |
| WO | WO 2014/133103 A1 | 9/2014 |

* cited by examiner

*Primary Examiner* — Margaret Moore
(74) *Attorney, Agent, or Firm* — Birch, Stewart, Kolasch & Birch, LLP

(57) ABSTRACT

The present invention is: a curable composition comprising a component (A) and a component (B) in a mass ratio (component (A):component (B)) of 100:0.3 to 100:40, the component (A) being a silane compound copolymer that is represented by a formula (a-1), and has a weight average molecular weight of 800 to 30,000, $$(CHR^1X^0\text{-}D\text{-}SiO_{3/2})_m(R^2SiO_{3/2})_n(CHR^1X^0\text{-}D\text{-}SiZO_{2/2})_o(R^2SiZO_{2/2})_p(CHR^1X^0\text{-}D\text{-}SiZ_2O_{1/2})_q(R^2SiZ_2O_{1/2})_r. \quad (a\text{-}1)$$

wherein $R^1$ is a hydrogen atom, etc., $X^0$ is a halogen atom, etc., D is a single bond, etc., $R^2$ is a substituted or unsubstituted alkyl group having 1 to 20 carbon atoms, etc., Z is a hydroxyl group, etc., m and n are independently a positive integer, and o, p, q, and r are independently 0 or a positive integer, and the component (B) being a silane coupling agent that includes a nitrogen atom in its molecule. With the invention, it is possible to provide: a curable composition that produces a cured product that exhibits excellent heat resistance, excellent transparency, and high adhesion; a cured product obtained by curing the curable composition; and a method for using the curable composition as an optical device adhesive, etc.

24 Claims, No Drawings

CURABLE COMPOSITION, CURED PRODUCT, AND METHOD FOR USING CURABLE COMPOSITION

TECHNICAL FIELD

The invention relates to a curable composition that produces a cured product which exhibits excellent transparency, excellent heat resistance, and high adhesion, a cured product obtained by curing the curable composition, and a method for using the curable composition as an optical device adhesive or an optical device sealant.

BACKGROUND ART

A curable composition has been improved in various ways taking account of the application, and widely used as a raw material for producing optical parts or formed articles, an adhesive, a coating agent, and the like. For example, a curable composition that produces a cured product that exhibits excellent transparency is preferably used as a raw material for producing optical parts or a coating agent, and a curable composition that produces a cured product that exhibits high adhesion is preferably used as an adhesive or a coating agent.

In recent years, a curable composition has also been used as an optical device-securing composition (e.g., optical device adhesive or optical device sealant) when producing a sealed optical device.

Examples of the optical device include a laser (e.g., semiconductor laser diode (LD)), a light-emitting device (e.g., light-emitting diode (LED)), a light-receiving device, a hybrid optical device, an optical integrated circuit, and the like. In recent years, an optical device that emits blue light or white light having a short peak wavelength has been developed, and widely used. The amount of heat generated by optical devices has increased along with a significant increase in brightness of light-emitting devices having a short emission peak wavelength.

Along with an increase in brightness of optical devices, a cured product of an optical device-securing composition may deteriorate, and produce cracks, or show a decrease in adhesion when exposed to light having higher energy, or subjected to a higher temperature generated by an optical device.

In order to solve this problem, Patent Documents 1 to 3 propose an optical device-securing composition that includes a polysilsesquioxane compound as the main component.

However, a cured product of each of the optical device-securing compositions disclosed in Patent Documents 1 to 3 that include a polysilsesquioxane compound as the main component may not exhibit sufficient heat resistance and transparency while maintaining sufficient adhesion.

Patent Document 4 proposes an epoxy resin composition that includes an alicyclic epoxy resin, and Patent Document 5 proposes an epoxy resin composition that includes a polythiol compound, as a composition for sealing an optical device.

However, these compositions may show a decrease in light resistance or adhesion with the passage of time.

Therefore, development of a curable composition that produces a cured product that exhibits more excellent heat resistance and transparency, and exhibits high adhesion has been desired.

RELATED-ART DOCUMENT

Patent Document

Patent Document 1: JP-A-2004-359933
Patent Document 2: JP-A-2005-263869
Patent Document 3: JP-A-2006-328231
Patent Document 4: JP-A-7-309927
Patent Document 5: JP-A-2009-001752

SUMMARY OF THE INVENTION

Technical Problem

The invention was conceived in view of the above situation. An object of the invention is to provide a curable composition that produces a cured product that exhibits excellent heat resistance, excellent transparency, and high adhesion even at a high temperature, a cured product obtained by curing the curable composition, and a method for using the curable composition as an optical device adhesive or an optical device sealant.

Solution to Problem

The inventors of the invention conducted extensive studies in order to achieve the above object. As a result, the inventors found that a composition that includes a specific silane compound copolymer and a silane coupling agent in a specific ratio produces a cured product that exhibits excellent transparency and excellent heat resistance for a long time, and exhibits high adhesion even at a high temperature. This finding has led to the completion of the invention.

Several aspects of the invention provide the following curable composition (see (1) to (9)), cured product (see (10) and (11)), and method for using a curable composition (see (12) and (13)).

(1) A curable composition including a component (A) and a component (B) in a mass ratio (component (A):component (B)) of 100:0.3 to 100:40, the component (A) being a silane compound copolymer that is represented by the following formula (a-1), and has a weight average molecular weight of 800 to 30,000, $$(CHR^1X^0\text{-D-SiO}_{3/2})_m(R^2SiO_{3/2})_n(CHR^1X^0\text{-D-SiZO}_{2/2})_o(R^2SiZO_{2/2})_p(CHR^1X^0\text{-D-SiZ}_2O_{1/2})_q(R^2SiZ_2O_{1/2})_r \quad (a\text{-}1)$$

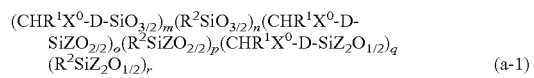

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, Z is a hydroxyl group, an alkoxy group having 1 to 10 carbon atoms, or a halogen atom, m and n are independently a positive integer, and o, p, q, and r are independently 0 or a positive integer, and the component (B) being a silane coupling agent that includes a nitrogen atom in its molecule.

(2) The curable composition according to (1), wherein m:n=60:40 to 5:95.

(3) The curable composition according to (1), wherein the component (B) is a 1,3,5-N-tris(trialkoxysilylalkyl) isocyanurate represented by the following formula (b-3), or an N,N'-bis(trialkoxysilylalkyl)urea represented by the following formula (b-4),

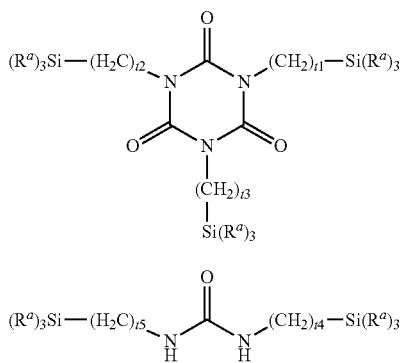

(b-3)

(b-4)

wherein $R^a$ are an alkoxy group having 1 to 6 carbon atoms, provided that a plurality of $R^a$ are either identical or different, and t1 to t5 are independently an integer from 1 to 10.

(3) A curable composition including a component (A') and a component (B) in a mass ratio (component (A'):component (B)) of 100:0.3 to 100:40, the component (A') being a silane compound copolymer that is produced by condensing a silane compound mixture, and has a weight average molecular weight of 800 to 30,000, the silane compound mixture including at least one silane compound (1) represented by the following formula (1), and at least one silane compound (2) represented by the following formula (2),

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^3$ is an alkyl group having 1 to 10 carbon atoms, $X^1$ is a halogen atom, and p is an integer from 0 to 3,

wherein $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, $R^4$ is an alkyl group having 1 to 10 carbon atoms, $X^2$ is a halogen atom, and v is an integer from 0 to 3, and the component (B) being a silane coupling agent that includes a nitrogen atom in its molecule.

(4) The curable composition according to (3), wherein the component (A') is a silane compound copolymer obtained by condensing the silane compound (1) and the silane compound (2) in a molar ratio (silane compound (1):silane compound (2)) of 60:40 to 5:95.

(5) The curable composition according to (3) or (4), wherein the component (B) is a 1,3,5-N-tris(trialkoxysilylalkyl) isocyanurate represented by the formula (b-3), or an N,N'-bis(trialkoxysilylalkyl)urea represented by the formula (b-4).

(6) A curable composition including a component (A") and a component (B) in a mass ratio (component (A"):component (B)) of 100:0.3 to 100:40, the component (A") being a silane compound copolymer that includes a repeating unit represented by the following formula (i) and a repeating unit represented by the following formula (ii), or the repeating unit represented by the formula (i) and a repeating unit represented by the following formula (iii), or the repeating unit represented by the formula (ii) and the repeating unit represented by the formula (iii), or the repeating unit represented by the formula (i), the repeating unit represented by the formula (ii), and the repeating unit represented by the formula (iii), and has a weight average molecular weight of 800 to 30,000,

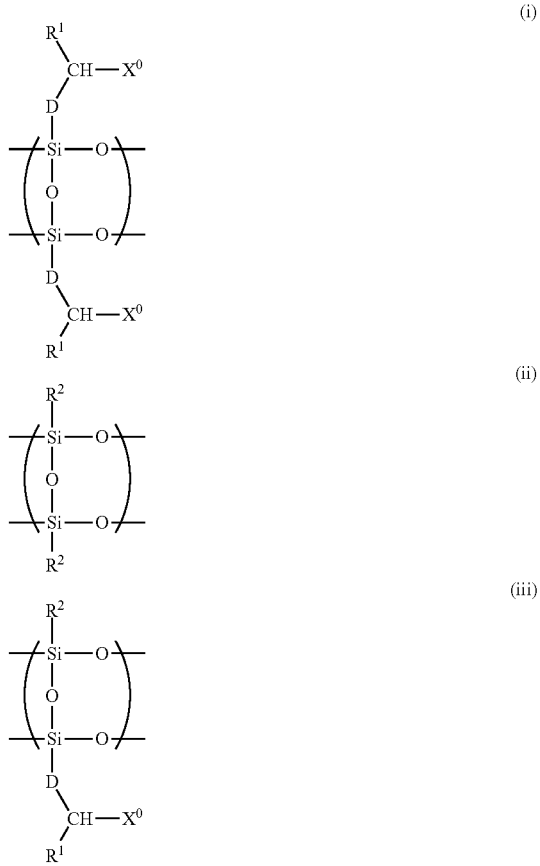

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, and the component (B) being a silane coupling agent that includes a nitrogen atom in its molecule.

(7) The curable composition according to (6), wherein the silane compound copolymer used as the component (A") includes a group represented by $R^1$—CH($X^0$)-D- and $R^2$ in a molar ratio (($R^1$—CH($X^0$)-D-):($R^2$)) of 60:40 to 5:95.

(8) The curable composition according to (6) or (7), wherein the component (B) is a 1,3,5-N-tris(trialkoxysilylalkyl) isocyanurate represented by the formula (b-3), or an N,N'-bis(trialkoxysilylalkyl)urea represented by the formula (b-4).

(9) The curable composition according to any one of (1) to (8), the curable composition being an optical device-securing composition.

(10) A cured product obtained by curing the curable composition according to any one of (1) to (8).

(11) The cured product according to (10), the cured product being an optical device-securing material.
(12) A method for using the curable composition according to any one of (1) to (8) as an optical device-securing adhesive.
(13) A method for using the curable composition according to any one of (1) to (8) as an optical device-securing sealant.

Advantageous Effects of the Invention

The curable composition according to one aspect of the invention can produce a cured product that does not show a deterioration in transparency due to coloration even when exposed to high-energy light or subjected to a high temperature, and exhibits excellent transparency and high adhesion for a long time.

The curable composition may be used to form an optical device-securing material, and may particularly suitably be used as an optical device adhesive or an optical device sealant.

DESCRIPTION OF EMBODIMENTS

A curable composition, a cured product, and a method for using a curable composition according to several exemplary embodiments of the invention are described in detail below.
1) Curable Composition
A curable composition according to one embodiment of the invention includes a component (A) and a component (B) (see below) in a mass ratio (component (A):component (B)) of 100:0.3 to 100:40.
Component (A) (Silane Compound Copolymer (A))
The component (A) included in the curable composition according to one embodiment of the invention is a silane compound copolymer (A) that is represented by the following formula (a-1), and has a weight average molecular weight of 800 to 30,000.

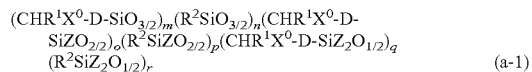

(a-1)

In the formula (a-1), $R^1$ is a hydrogen atom or an alkyl group having 1 to 6 carbon atoms. Examples of the alkyl group having 1 to 6 carbon atoms represented by $R^1$ include a methyl group, an ethyl group, an n-propyl group, an isopropyl group, an n-butyl group, an isobutyl group, an s-butyl group, a t-butyl group, an n-pentyl group, an n-hexyl group, and the like.

$R^1$ is preferably a hydrogen atom.

$X^0$ is a halogen atom (e.g., fluorine atom, chlorine atom, bromine atom, or iodine atom), a cyano group, or a group represented by OG.

G is a protecting group for a hydroxyl group. The protecting group for a hydroxyl group may be an arbitrary protecting group that is known in the art as a protecting group for a hydroxyl group. Examples of the protecting group include an acyl-based protecting group; a silyl-based protecting group such as a trimethylsilyl group, a triethylsilyl group, a t-butyldimethylsilyl group, and a t-butyldiphenylsilyl group; an acetal-based protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-based protecting group such as a t-butoxycarbonyl group; an ether-based protecting group such as a methyl group, an ethyl group, a t-butyl group, an octyl group, an allyl group, a triphenylmethyl group, a benzyl group, a p-methoxybenzyl group, a fluorenyl group, a trityl group, and a benzhydryl group; and the like. G is preferably an acyl-based protecting group.

The acyl-based protecting group is represented by —C(=O)$R^5$ (wherein $R^5$ is an alkyl group having 1 to 6 carbon atoms (e.g., methyl group, ethyl group, n-propyl group, isopropyl group, n-butyl group, isobutyl group, s-butyl group, t-butyl group, or n-pentyl group), or a substituted or unsubstituted phenyl group).

Examples of a substituent that may substitute the unsubstituted phenyl group represented by $R^5$ include alkyl groups such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; halogen atoms such as a fluorine atom, a chlorine atom, and a bromine atom; alkoxy groups such as a methoxy group and an ethoxy group; and the like.

$X^0$ is preferably an atom or a group selected from a chlorine atom, the group represented by OG' (wherein G' is an acyl-based protecting group), and a cyano group, more preferably an atom or a group selected from a chlorine atom, an acetoxy group, and a cyano group, and particularly preferably a cyano group, from the viewpoint of availability and a capability to produce a cured product that exhibits high adhesion.

D is a single bond or a substituted or unsubstituted divalent organic group having 1 to 20 carbon atoms.

Examples of the divalent organic group having 1 to 20 carbon atoms include alkylene groups having 1 to 20 carbon atoms, alkenylene groups having 2 to 20 carbon atoms, alkynylene groups having 2 to 20 carbon atoms, arylene groups having 6 to 20 carbon atoms, divalent groups having 7 to 20 carbon atoms obtained by combining an alkylene group, an alkenylene group, or an alkynylene group with an arylene group, and the like.

Examples of the alkylene groups having 1 to 20 carbon atoms include a methylene group, an ethylene group, a propylene group, a trimethylene group, a tetramethylene group, a pentamethylene group, a hexamethylene group, and the like.

Examples of the alkenylene groups having 2 to 20 carbon atoms include a vinylene group, a propenylene group, a butenylene group, a pentenylene group, and the like.

Examples of the alkynylene groups having 2 to 20 carbon atoms include an ethynylene group, a propynylene group, and the like.

Examples of the arylene groups having 6 to 20 carbon atoms include an o-phenylene group, an m-phenylene group, a p-phenylene group, a 2,6-naphthylene group, and the like.

Examples of a substituent that may substitute the alkylene groups having 1 to 20 carbon atoms, the alkenylene groups having 2 to 20 carbon atoms, and the alkynylene groups having 2 to 20 carbon atoms include halogen atoms such as a fluorine atom and a chlorine atom; alkoxy groups such as a methoxy group and an ethoxy group; alkylthio groups such as a methylthio group and an ethylthio group; alkoxycarbonyl groups such as a methoxycarbonyl group and an ethoxycarbonyl group; and the like.

Examples of a substituent that may substitute the arylene groups having 6 to 20 carbon atoms include a cyano group; a nitro group; halogen atoms such as a fluorine atom, a chlorine atom, and a bromine atom; alkyl groups such as a methyl group and an ethyl group; alkoxy groups such as a methoxy group and an ethoxy group; alkylthio groups such as a methylthio group and an ethylthio group; and the like.

These substituents may be bonded to the alkylene group, the alkenylene group, the alkynylene group, or the arylene group at an arbitrary position. A plurality of identical or different substituents may be bonded to the alkylene group, the alkenylene group, the alkynylene group, or the arylene group.

Examples of the divalent group obtained by combining a substituted or unsubstituted alkylene group, a substituted or unsubstituted alkenylene group, or a substituted or unsubstituted alkynylene group with a substituted or unsubstituted arylene group include a group in which at least one group among a substituted or unsubstituted alkylene group, a substituted or unsubstituted alkenylene group, and a substituted or unsubstituted alkynylene group is linearly bonded to at least one substituted or unsubstituted arylene group, and the like. Specific examples of the divalent group include the groups respectively represented by the following formulas, and the like.

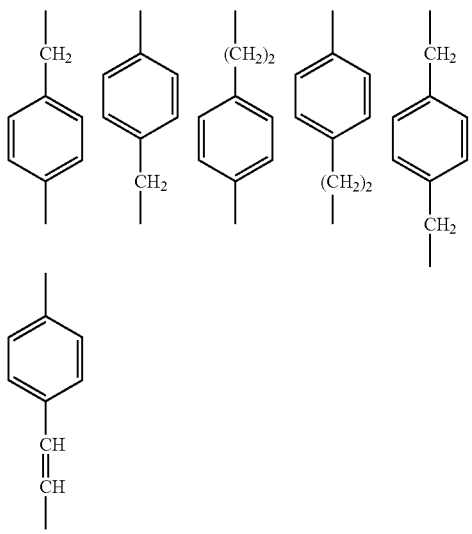

D is preferably an alkylene group having 1 to 10 carbon atoms, more preferably an alkylene group having 1 to 6 carbon atoms, and particularly preferably a methylene group or an ethylene group, since a cured product that exhibits high adhesion can be obtained.

$R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group.

Examples of the alkyl group having 1 to 20 carbon atoms represented by $R^2$ include a methyl group, an ethyl group, an n-propyl group, an isopropyl group, an n-butyl group, an s-butyl group, an isobutyl group, a t-butyl group, an n-pentyl group, an n-hexyl group, an n-octyl group, an isooctyl group, an n-nonyl group, an n-decyl group, an n-dodecyl group, and the like.

Examples of a substituent that may substitute the unsubstituted alkyl group having 1 to 20 carbon atoms represented by $R^2$ include alkoxy groups having 1 to 6 carbon atoms such as a methoxy group and an ethoxy group; substituted or unsubstituted aryl groups such as a phenyl group, a 4-methylphenyl group, a 3-methoxyphenyl group, a 2,4-dichlorophenyl group, a 1-naphthyl group, and a 2-naphthyl group; and the like.

Examples of a substituent that may substitute the unsubstituted phenyl group represented by $R^2$ include alkyl groups such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; alkoxy groups such as a methoxy group and an ethoxy group; halogen atoms such as a fluorine atom and a chlorine atom; and the like.

Specific examples of the substituted or unsubstituted phenyl group represented by $R^2$ include a phenyl group, a 2-chlorophenyl group, a 4-methylphenyl group, a 3-ethylphenyl group, a 2,4-dimethylphenyl group, a 2-methoxyphenyl group, and the like.

$R^2$ is preferably an alkyl group having 1 to 20 carbon atoms or a substituted or unsubstituted phenyl group, more preferably an alkyl group having 1 to 6 carbon atoms or a substituted or unsubstituted phenyl group, and particularly preferably an alkyl group having 1 to 6 carbon atoms or a phenyl group.

Z is a hydroxyl group, an alkoxy group having 1 to 10 carbon atoms, or a halogen atom. Examples of the alkoxy group having 1 to 10 carbon atoms include a methoxy group, an ethoxy group, a propoxy group, an isopropoxy group, a butoxy group, a t-butoxy group, a pentyloxy group, a hexyloxy group, an octyloxy group, and the like. Examples of the halogen atom include a fluorine atom, a chlorine atom, a bromine atom, and the like.

Z is preferably a hydroxyl group or an alkoxy group having 1 to 6 carbon atoms.

m and n are independently a positive integer. It is preferable that m and n be positive integers that satisfy m:n=60:40 to 5:95 since the advantageous effects of the invention can be more easily achieved.

o, p, q, and r are independently 0 or a positive integer.

The silane compound copolymer (A) may be a random copolymer, a block copolymer, a graft copolymer, an alternating copolymer, or the like. The silane compound copolymer (A) may have a ladder structure, a double decker structure, a basket structure, a partially cleaved basket structure, a cyclic structure, or a random structure.

The weight average molecular weight (Mw) of the silane compound copolymer (A) is 800 to 30,000, preferably 1000 to 6000, and more preferably 1500 to 2000. When the weight average molecular weight (Mw) of the silane compound copolymer (A) is within the above range, the resulting composition exhibits an excellent handling capability, and produces a cured product that exhibits excellent adhesion and excellent heat resistance. The weight average molecular weight (Mw) of the silane compound copolymer (A) may be determined as a standard polystyrene-reduced value by gel permeation chromatography (GPC) using tetrahydrofuran (THF) as a solvent, for example (hereinafter the same).

The molecular weight distribution (Mw/Mn) of the silane compound copolymer (A) is not particularly limited, but is normally 1.0 to 3.0, and preferably 1.1 to 2.0. When the molecular weight distribution (Mw/Mn) of the silane compound copolymer (A) is within the above range, a cured product that exhibits excellent adhesion and excellent heat resistance can be obtained.

Note that only one type of the silane compound copolymer (A) may be used, or two or more types of the silane compound copolymer (A) may be used in combination.

The silane compound copolymer (A) (i.e., component (A)) included in the curable composition according to one embodiment of the invention may be produced by an arbitrary method. It is preferable to produce the silane compound copolymer (A) by condensing the silane compound (1) and the silane compound (2) as described later in connection with the silane compound copolymer (A').

When producing the silane compound copolymer (A) (i.e., component (A)) by condensing (reacting) the silane compound (1) and the silane compound (2) as described later in connection with the silane compound copolymer (A'), $OR^3$ or $X^1$ included in the silane compound (1) remains in the silane compound copolymer (A) when $OR^3$ or $X^1$ is not subjected to dehydration and dealcoholization condensation. When one $OR^3$ or $X^1$ is not subjected to condensation, the one $OR^3$ or $X^1$ remains in the silane compound copolymer represented by the formula (a-1) as $(CHR^1X^0\text{-}D\text{-}SiZO_{2/2})$. When two $OR^3$ or $X^1$ are not subjected to condensation, the two $OR^3$ or $X^1$ remain in the silane compound copolymer represented by the formula (a-1) as $(CHR^1X^0\text{-}D\text{-}SiZ_2O_{1/2})$.

$OR^4$ or $X^2$ included in the silane compound (2) remains in the silane compound copolymer (A) when $OR^4$ or $X^2$ is not subjected to dehydration and dealcoholization condensation. When one $OR^4$ or $X^2$ is not subjected to condensation, the one $OR^4$ or $X^2$ remains in the silane compound copolymer represented by the formula (a-1) as $(R^2SiZO_{2/2})$. When two $OR^4$ or $X^2$ are not subjected to condensation, the two $OR^4$ or $X^2$ remain in the silane compound copolymer represented by the formula (a-1) as $(R^2SiZ_2O_{1/2})$.

The component (A) may be the following component (A').
Component (A'): A silane compound copolymer that is produced by condensing a silane compound mixture, and has a weight average molecular weight of 800 to 30,000, the silane compound mixture including at least one silane compound (1) represented by the formula (1): $R^1\text{—}CH(X^0)\text{-}D\text{-}Si(OR^3)_u(X^1)_{3-u}$, and at least one silane compound (2) represented by the formula (2): $R^2Si(OR^4)_v(X^2)_{3-v}$, (hereinafter may be referred to as "silane compound copolymer (A')")

Silane Compound (1)

The silane compound (1) is represented by the formula (1): $R^1\text{—}CH(X^0)\text{-}D\text{-}Si(OR^3)_u(X^1)_{3-u}$. A silane compound copolymer that exhibits excellent transparency and excellent adhesion even after being cured can be obtained by utilizing the silane compound (1).

In the formula (1), $R^1$, $X^0$, and D are the same as defined above. $R^3$ is an alkyl group having 1 to 10 carbon atoms, $X^1$ is a halogen atom, and u is an integer from 0 to 3.

Examples of the alkyl group having 1 to 10 carbon atoms represented by $R^3$ include a methyl group, an ethyl group, an n-propyl group, an isopropyl group, an n-butyl group, an s-butyl group, an isobutyl group, a t-butyl group, an n-pentyl, an n-hexyl group, and the like.

Examples of the halogen atom represented by $X^1$ include a fluorine atom, a chlorine atom, a bromine atom, and the like.

When u is an integer equal to or larger than 2, $OR^3$ are either identical or different. When (3-u) is an integer equal to or larger than 2, $X^1$ are either identical or different.

Specific examples of the silane compound (1) include trialkoxysilane compounds such as cyanomethyltrimethoxysilane, cyanomethyltriethoxysilane, 1-cyanoethyltrimethoxysilane, 2-cyanoethyltrimethoxysilane, 2-cyanoethyltriethoxysilane, 2-cyanoethyltripropoxysilane, 3-cyanopropyltrimethoxysilane, 3-cyanopropyltriethoxysilane, 3-cyanopropyltripropoxysilane, 3-cyanopropyltributoxysilane, 4-cyanobutyltrimethoxysilane, 5-cyanopentyltrimethoxysilane, 2-cyanopropyltrimethoxysilane, 2-(cyanomethoxy)ethyltrimethoxysilane, 2-(2-cyanoethoxy)ethyltrimethoxysilane, o-(cyanomethyl)phenyltripropoxysilane, m-(cyanomethyl)phenyltrimethoxysilane, p-(cyanomethyl)phenyltriethoxysilane, and p-(2-cyanoethyl)phenyltrimethoxysilane; halogenosilane compounds such as cyanomethyltrichlorosilane, cyanomethylbromodimethoxysilane, 2-cyanoethyldichloromethoxysilane, 2-cyanoethyldichloroethoxysilane, 3-cyanopropyltrichlorosilane, 3-cyanopropyltribromosilane, 3-cyanopropyldichloromethoxysilane, 3-cyanopropyldichloroethoxysilane, 3-cyanopropylchlorodimethoxysilane, 3-cyanopropylchlorodiethoxysilane, 4-cyanobutylchlorodiethoxysilane, 3-cyano-n-butylchlorodiethoxysilane, 2-(2-cyanoethoxy)ethyltrichlorosilane, 2-(2-cyanoethoxy)ethylbromodiethoxysilane, 2-(2-cyanoethoxy)ethyldichloropropoxysilane, o-(2-cyanoethyl)phenyltrichlorosilane, m-(2-cyanoethyl)phenylmethoxydibromosilane, p-(2-cyanoethyl)phenyldimethoxychlorosilane, and p-(2-cyanoethyl)phenyltribromosilane; and the like.

These silane compounds (1) may be used either alone or in combination.

It is preferable that the silane compound (1) be a trialkoxysilane compound, and more preferably a trialkoxysilane compound that includes a 2-cyanoethyl group, a 3-cyanopropyl group, a 3-acetoxypropyl group, or a 3-halogenopropyl group, since a cured product that exhibits more excellent adhesion can be obtained.

Silane Compound (2)

The silane compound (2) is represented by the formula (2): $R^2Si(OR^4)_v(X^2)_{3-v}$. In the formula (2), $R^2$ is the same as defined above. $R^4$ is an alkyl group having 1 to 10 carbon atoms similar to that represented by $R^3$, $X^2$ is a halogen atom similar to that represented by $X^1$, and v is an integer from 0 to 3.

When v is an integer equal to or larger than 2, $OR^4$ are either identical or different. When (3-v) is an integer equal to or larger than 2, $X^2$ are either identical or different.

Specific examples of the silane compound (2) include alkyltrialkoxysilane compounds such as methyltrimethoxysilane, methyltriethoxysilane, ethyltrimethoxysilane, ethyltriethoxysilane, n-propyltrimethoxysilane, n-butyltriethoxysilane, i-butyltrimethoxysilane, n-pentyltriethoxysilane, n-hexyltrimethoxysilane, i-octyltriethoxysilane, dodecyltrimethoxysilane, methyldimethoxyethoxysilane, and methyldiethoxymethoxysilane; alkylhalogenoalkoxysilane compounds such as methylchlorodimethoxysilane, methyldichloromethoxysilane, methyldichloromethoxysilane, methylchlorodiethoxysilane, ethylchlorodimethoxysilane, ethyldichloromethoxysilane, n-propylchlorodimethoxysilane, and n-propyldichloromethoxysilane; alkyltrihalogenosilane compounds such as methyltrichlorosilane, methyltribromosilane, ethyltrichlorosilane, ethyltribromosilane, and n-propyltrichlorosilane; substituted or unsubstituted phenyltrialkoxysilane compounds such as phenyltrimethoxysilane, 4-methoxyphenyltrimethoxysilane, 2-chlorophenyltrimethoxysilane, phenyltriethoxysilane, 2-methoxyphenyltriethoxysilane, phenyldimethoxyethoxysilane, and phenyldiethoxymethoxysilane; substituted or unsubstituted phenylhalogenoalkoxysilane compounds such as phenylchlorodimethoxysilane, phenyldichloromethoxysilane, phenylchloromethoxyethoxysilane, phenylchlorodiethoxysilane, and phenyldichloroethoxysilane; and substituted or unsubstituted phenyltrihalogenosilane compounds such as phenyltrichlorosilane, phenyltribromosilane, 4-methoxyphenyltrichlorosilane, 2-ethoxyphenyltrichlorosilane, and 2-chlorophenyltrichlorosilane.

These silane compounds (2) may be used either alone or in combination.

It is preferable that the silane compound (2) be an alkyltrialkoxysilane compound having 1 to 6 carbon atoms or a substituted or unsubstituted phenyltrialkoxysilane compound.

Silane Compound Mixture

The silane compound mixture that is used to produce the silane compound copolymer (A') may be a mixture that includes only the silane compound (1) and the silane compound (2), or may be a mixture that further includes a silane compound other than the silane compound (1) and the silane compound (2) as long as the object of the invention is not impaired. Note that the silane compound mixture is preferably a mixture that includes only the silane compound (1) and the silane compound (2).

The silane compound (1) and the silane compound (2) are preferably used in a molar ratio (silane compound (1):silane compound (2)) of 60:40 to 5:95, and more preferably 40:60 to 10:90.

The silane compound mixture may be condensed by an arbitrary method. For example, the silane compound mixture may be condensed by dissolving the silane compound (1), the silane compound (2), and an additional silane compound in a solvent, adding a given amount of catalyst to the solution, and stirring the mixture at a given temperature.

An acid catalyst or a base catalyst may be used as the catalyst.

Examples of the acid catalyst include inorganic acids such as hydrochloric acid, sulfuric acid, nitric acid, and phosphoric acid; organic acids such as methanesulfonic acid, trifluoromethanesulfonic acid, benzenesulfonic acid, p-toluenesulfonic acid, acetic acid, and trifluoroacetic acid; and the like.

Examples of the base catalyst include organic bases such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; organic base hydroxides such as tetramethylammonium hydroxide and tetraethylammonium hydroxide; metal alkoxides such as sodium methoxide, sodium ethoxide, sodium t-butoxide, and potassium t-butoxide; metal hydrides such as sodium hydride and calcium hydride; metal hydroxides such as sodium hydroxide, potassium hydroxide, and calcium hydroxide; metal carbonates such as sodium carbonate, potassium carbonate, and magnesium carbonate; metal hydrogen carbonates such as sodium hydrogen carbonate and potassium hydrogen carbonate; and the like.

The catalyst is normally used in a ratio of 0.1 to 10 mol %, and preferably 1 to 5 mol %, based on the total number of moles of the silane compounds.

The solvent may be appropriately selected taking account of the type of silane compound and the like. Examples of the solvent include water; aromatic hydrocarbons such as benzene, toluene, and xylene; esters such as methyl acetate, ethyl acetate, propyl acetate, and methyl propionate; ketones such as acetone, methyl ethyl ketone, methyl i-butyl ketone, and cyclohexanone; alcohols such as methyl alcohol, ethyl alcohol, n-propyl alcohol, i-propyl alcohol, n-butyl alcohol, i-butyl alcohol, s-butyl alcohol, and t-butyl alcohol; and the like. These solvents may be used either alone or in combination.

The solvent is normally used so that the total number of moles of the silane compounds is 0.1 to 10 mol, and preferably 0.5 to 10 mol, per liter of the solvent.

The silane compounds are normally condensed (reacted) in a temperature range of 0° C. to the boiling point of the solvent (preferably 20 to 100° C.). If the reaction temperature is too low, condensation may not proceed sufficiently. If the reaction temperature is too high, it may be difficult to suppress gelation. The reaction is normally completed within 30 minutes to 20 hours.

After completion of the reaction, the mixture is neutralized by adding an aqueous solution of an alkali (e.g., sodium hydrogen carbonate) when using the acid catalyst, or neutralized by adding an acid (e.g., hydrochloric acid) when using the base catalyst. Salts produced during neutralization are removed by filtration, washing with water, or the like to obtain the target silane compound copolymer.

The weight average molecular weight (Mw) of the silane compound copolymer (A') is 800 to 30,000, preferably 1000 to 6000, and more preferably 1500 to 2000. When the weight average molecular weight (Mw) of the silane compound copolymer (A') is within the above range, the resulting composition exhibits an excellent handling capability, and produces a cured product that exhibits excellent adhesion and excellent heat resistance.

The molecular weight distribution (Mw/Mn) of the silane compound copolymer (A') is not particularly limited, but is normally 1.0 to 3.0, and preferably 1.1 to 2.0. When the molecular weight distribution (Mw/Mn) of the silane compound copolymer (A') is within the above range, a cured product that exhibits excellent adhesion and excellent heat resistance can be obtained.

The component (A) may be the following component (A"). Component (A"): A silane compound copolymer that includes a repeating unit represented by the following formula (i) and a repeating unit represented by the following formula (ii), or the repeating unit represented by the formula (i) and a repeating unit represented by the following formula (iii), or the repeating unit represented by the formula (ii) and the repeating unit represented by the formula (iii), or the repeating unit represented by the formula (i), the repeating unit represented by the formula (ii), and the repeating unit represented by the formula (iii), and has a weight average molecular weight of 800 to 30,000 (hereinafter referred to as "silane compound copolymer (A")")

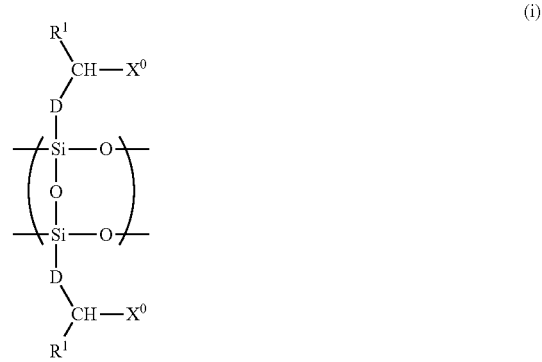

(i)

(ii)

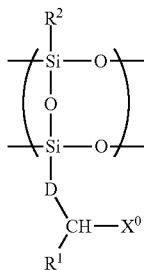

(iii)

wherein $R^1$, $R^2$, D, and $X^0$ are the same as defined above.

The silane compound copolymer (A") may include only one type of the repeating unit represented by the formula (i), or may include two or more types of the repeating unit represented by the formula (i). The silane compound copolymer (A") may include only one type of the repeating unit represented by the formula (ii), or may include two or more types of the repeating unit represented by the formula (ii). The silane compound copolymer (A") may include only one type of the repeating unit represented by the formula (iii), or may include two or more types of the repeating unit represented by the formula (iii).

The silane compound copolymer (A") preferably includes the group represented by $R^1$—CH($X^0$)-D- and the group represented by $R^2$ in a molar ratio ($R^1$—CH($X^0$)-D:$R^2$) of 60:40 to 5:95, and more preferably 40:60 to 10:90. When the molar ratio ($R^1$—CH($X^0$)-D:$R^2$) is within the above range, a cured product that exhibits excellent transparency, excellent adhesion, and excellent heat resistance can be obtained, and a deterioration in transparency, adhesion, and heat resistance can be suppressed even when the cured product is subjected to a high temperature.

The content of the group represented by $R^1$—CH($X^0$)-D- and the content of the group represented by $R^2$ may be determined by measuring the NMR spectrum of the silane compound copolymer (A"), for example.

The silane compound copolymer (A") may be a random copolymer, a block copolymer, a graft copolymer, an alternating copolymer, or the like.

The weight average molecular weight (Mw) of the silane compound copolymer (A") is 800 to 30,000, preferably 1000 to 6000, and more preferably 1500 to 2000. When the weight average molecular weight (Mw) of the silane compound copolymer (A") is within the above range, the resulting composition exhibits an excellent handling capability, and produces a cured product that exhibits excellent adhesion and excellent heat resistance.

The molecular weight distribution (Mw/Mn) of the silane compound copolymer (A") is not particularly limited, but is normally 1.0 to 3.0, and preferably 1.1 to 2.0. When the molecular weight distribution (Mw/Mn) of the silane compound copolymer (A") is within the above range, a cured product that exhibits excellent adhesion and excellent heat resistance can be obtained.

Note that only one type of the silane compound copolymer (A") may be used, or two or more types of the silane compound copolymer (A") may be used in combination.

Component (B) (Silane Coupling Agent)

The curable composition according to one embodiment of the invention includes a silane coupling agent that includes a nitrogen atom in its molecule (hereinafter may be referred to as "silane coupling agent (B)") as the component (B). The curable composition that includes the silane coupling agent (B) can produce a cured product that does not show a deterioration in transparency due to coloration even when exposed to high-energy light or subjected to a high temperature, exhibits excellent transparency for a long time, and exhibits high adhesion.

The silane coupling agent (B) is not particularly limited as long as the silane coupling agent (B) includes a nitrogen atom in its molecule. Examples of the silane coupling agent (B) include a trialkoxysilane compound represented by the following formula (b-1), a dialkoxyalkylsilane compound or a dialkoxyarylsilane compound represented by the following formula (b-2), and the like.

$$(R^a)_3SiR^c \tag{b-1}$$

$$(R^a)_2(R^b)SiR^c \tag{b-2}$$

wherein $R^a$ is an alkoxy group having 1 to 6 carbon atoms, such as a methoxy group, an ethoxy group, an n-propoxy group, an isopropoxy group, an n-butoxy group, or a t-butoxy group.

$R^b$ is an alkyl group having 1 to 6 carbon atoms, such as a methyl group, an ethyl group, an n-propyl group, an isopropyl group, an n-butyl group, or a t-butyl group, or a substituted or unsubstituted aryl group such as a phenyl group, a 4-chlorophenyl group, or a 4-methylphenyl group.

$R^c$ is an organic group having 1 to 10 carbon atoms that includes a nitrogen atom. $R^c$ is optionally bonded to a group that includes a silicon atom.

Specific examples of the organic group having 1 to 10 carbon atoms represented by $R^c$ include an N-2-(aminoethyl)-3-aminopropyl group, a 3-aminopropyl group, an N-(1, 3-dimethylbutylidene)aminopropyl group, a 3-ureidopropyl-triethoxysilane group, an N-phenylaminopropyl group, and the like.

Examples of the compound represented by the formula (b-1) or (b-2) wherein $R^c$ is an organic group bonded to a group that includes a silicon atom, include a compound in which $R^c$ is bonded to the silicon atom through an isocyanurate skeleton to form an isocyanurate-based silane coupling agent, and a compound in which $R^c$ is bonded to the silicon atom through a urea skeleton to form a urea-based silane coupling agent.

The silane coupling agent (B) is preferably an isocyanurate-based silane coupling agent or a urea-based silane coupling agent, and more preferably an isocyanurate-based silane coupling agent or a urea-based silane coupling agent that includes four or more alkoxy groups bonded to a silicon atom in the molecule, from the viewpoint of a capability to produce a cured product that exhibits higher adhesion.

The expression "includes four or more alkoxy groups bonded to a silicon atom" used herein means that the total number of alkoxy groups bonded to an identical silicon atom and alkoxy groups bonded to different silicon atoms is equal to or larger than 4.

Examples of the isocyanurate-based silane coupling agent that includes four or more alkoxy groups bonded to a silicon atom include a compound represented by the following formula (b-3). Examples of the urea-based silane coupling agent that includes four or more alkoxy groups bonded to a silicon atom include a compound represented by the following formula (b-4).

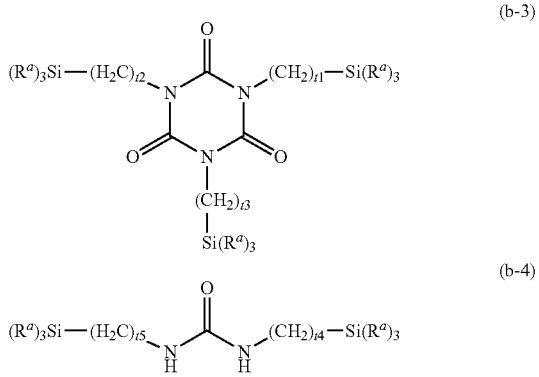

wherein $R^a$ is the same as defined above, provided that a plurality of $R^a$ are either identical or different.

t1 to t5 are independently an integer from 1 to 10, preferably an integer from 1 to 6, and particularly preferably 3.

Specific examples of the compound represented by the formula (b-3) include 1,3,5-N-tris[(tri($C_{1-6}$)alkoxy)silyl($C_{1-10}$)alkyl)isocyanurates such as 1,3,5-N-tris(3-trimethoxysilylpropyl)isocyanurate, 1,3,5-N-tris(3-triethoxysilylpropyl) isocyanurate, 1,3,5-N-tris(3-tri-i-propoxysilylpropyl) isocyanurate, and 1,3,5-N-tris(3-tributoxysilylpropyl) isocyanurate; 1,3,5-N-tris[(di($C_{1-6}$)alkoxy)silyl($C_{1-10}$)alkyl) isocyanurates such as 1,3,5-N-tris(3-dimethoxymethylsilylpropyl)isocyanurate, 1,3,5-N-tris(3-dimethoxyethylsilylpropyl)isocyanurate, 1,3,5-N-tris(3-dimethoxy-i-propylsilylpropyl)isocyanurate, 1,3,5-N-tris(3-dimethoxy-n-propylsilylpropyl)isocyanurate, 1,3,5-N-tris(3-dimethoxyphenylsilylpropyl)isocyanurate, 1,3,5-N-tris(3-diethoxymethylsilylpropyl)isocyanurate, 1,3,5-N-tris(3-diethoxyethylsilylpropyl)isocyanurate, 1,3,5-N-tris(3-diethoxyi-propylsilylpropyl)isocyanurate, 1,3,5-N-tris(3-diethoxy-n-propylsilylpropyl)isocyanurate, 1,3,5-N-tris(3-diethoxyphenylsilylpropyl)isocyanurate, 1,3,5-N-tris(3-di-i-propoxymethylsilylpropyl)isocyanurate, 1,3,5-N-tris(3-di-i-propoxyethylsilylpropyl)isocyanurate, 1,3,5-N-tris(3-di-i-propoxy-i-propylsilylpropyl)isocyanurate, 1,3,5-N-tris(3-dii-propoxy-n-propylsilylpropyl)isocyanurate, 1,3,5-N-tris (3-dii-propoxyphenylsilylpropyl)isocyanurate, 1,3,5-N-tris (3-dibutoxymethylsilylpropyl)isocyanurate, 1,3,5-N-tris(3-dibutoxyethylsilylpropyl)isocyanurate, 1,3,5-N-tris(3-dibutoxy-i-propylsilylpropyl)isocyanurate, 1,3,5-N-tris(3-dibutoxy-n-propylsilylpropyl)isocyanurate, and 1,3,5-N-tris (3-dibutoxyphenylsilylpropyl)isocyanurate; and the like.

Specific examples of the compound represented by the formula (b-4) include N,N'-bis[(tri($C_{1-6}$)alkoxysilyl)($C_{1-10}$) alkyl)ureas such as N,N'-bis(3-trimethoxysilylpropyl)urea, N,N'-bis(3-triethoxysilylpropyl)urea, N,N'-bis(3-tripropoxysilylpropyl)urea, N,N'-bis(3-tributoxysilylpropyl)urea, and N,N'-bis(2-trimethoxysilylethyl)urea; N,N'-bis[(di($C_{1-6}$) alkoxy($C_{1-6}$)alkylsilyl($C_{1-10}$)alkyl)ureas such as N,N'-bis(3-dimethoxymethylsilylpropyl)urea, N,N'-bis(3-dimethoxyethylsilylpropyl)urea, and N,N'-bis(3-diethoxymethylsilylpropyl)urea; N,N'-bis[(di($C_{1-6}$)alkoxy ($C_{6-20}$)arylsilyl($C_{1-10}$)alkyl)ureas such as N,N'-bis(3-dimethoxyphenylsilylpropyl)urea and N,N'-bis(3-diethoxyphenylsilylpropyl)urea; and the like.

These compounds may be used either alone or in combination.

It is preferable to use 1,3,5-N-tris(3-trimethoxysilylpropyl)isocyanurate, 1,3,5,-N-tris(3-triethoxysilylpropyl)isocyanurate (hereinafter referred to as "isocyanurate compound"), N,N'-bis(3-trimethoxysilylpropyl)urea, N,N'-bis(3-triethoxysilylpropyl)urea (hereinafter referred to as "urea compound"), or a combination of the isocyanurate compound and the urea compound as the component (B). It is preferable to use a combination of the isocyanurate compound and the urea compound as the component (B) since a cured product that exhibits more excellent adhesion can be obtained.

When using a combination of the isocyanurate compound and the urea compound as the component (B), the isocyanurate compound and the urea compound are preferably used in a mass ratio (isocyanurate compound:urea compound) of 100:1 to 100:200, and more preferably 100:110.

The isocyanurate compound is preferably used in an amount of 35 parts by mass or less, and more preferably 25 parts by mass or less, based on 100 parts by mass of the component (A). This applies to the case where the isocyanurate compound is used alone, and the case where the isocyanurate compound is used in combination with the urea compound.

The urea compound is preferably used in an amount of 20 parts by mass or less, and more preferably 15 parts by mass or less, based on 100 parts by mass of the component (A). This applies to the case where the urea compound is used alone, and the case where the urea compound is used in combination with the isocyanurate compound.

The curable composition according to one embodiment of the invention includes the component (A) (or the component (A') or (A"), hereinafter the same) and the component (B) in a mass ratio (component (A):component (B)) of 100:0.3 to 100:40.

When the curable composition includes the component (A) and the component (B) in a mass ratio within the above range, it is possible to obtain a curable composition that produces a cured product that exhibits excellent transparency, high adhesion, and excellent heat resistance, and rarely shows a deterioration in adhesion even when subjected to a high temperature. The mass ratio (component (A):component (B)) of the component (A) to the component (B) is more preferably 100:1 to 100:30, and still more preferably 100:3 to 100:25.

The curable composition according to one embodiment of the invention may include an additional component other than the above components as long as the object of the invention is not impaired.

Examples of the additional component include a silane coupling agent other than the silane coupling agent used as the component (B), an antioxidant, a UV absorber, a light stabilizer, a diluent, and the like.

The silane coupling agent other than the silane coupling agent used as the component (B) is not particularly limited as long as the object of the invention is not impaired. It is preferable to use a silane coupling agent having an acid anhydride structure (e.g., 2-trimethoxysilylethylsuccinic anhydride and 3-triethoxysilylpropylsuccinic anhydride) since a cured product that exhibits higher adhesion can be obtained.

These silane coupling agents having an acid anhydride structure may be used either alone or in combination.

The antioxidant is added to the curable composition in order to prevent a deterioration due to oxidation during heating. Examples of the antioxidant include phosphorus-based antioxidants, phenol-based antioxidants, sulfur-based antioxidants, and the like.

Examples of the phosphorus-based antioxidants include phosphites, oxaphosphaphenanthrene oxides, and the like.

Examples of the phenol-based antioxidants include monophenols, bisphenols, polyphenols, and the like.

Examples of the sulfur-based antioxidants include dilauryl 3,3'-thiodipropionate, dimyristyl 3,3'-thiodipropionate, distearyl 3,3'-thiodipropionate, and the like.

These antioxidants may be used either alone or in combination. The antioxidant is normally used in a ratio of 10 mass % or less based on the component (A).

The UV absorber is added to the curable composition in order to improve the light resistance of the resulting cured product.

Examples of the UV absorber include salicylic acids, benzophenones, benzotriazoles, hindered amines, and the like.

These UV absorbers may be used either alone or in combination.

The UV absorber is normally used in a ratio of 10 mass % or less based on the component (A).

The light stabilizer is added to the curable composition in order to improve the light resistance of the resulting cured product.

Examples of the light stabilizer include hindered amines such as poly[{6-(1,1,3,3-tetramethylbutyl)amino-1,3,5-triazine-2,4-diyl}{(2,2,6,6-tetramethyl-4-piperidine)imino}hexamethylene{(2,2,6,6-tetramethyl-4-piperidine)imino}], and the like.

These light stabilizers may be used either alone or in combination.

These additional components are normally used in a ratio of 20 mass % or less based on the component (A).

The diluent is added to the curable composition in order to adjust the viscosity of the curable composition.

Examples of the diluent include glycerol diglycidyl ether, butanediol diglycidyl ether, diglycidylaniline, neopentyl glycol glycidyl ether, cyclohexanedimethanol diglycidyl ether, alkylene diglycidyl ether, polyglycol diglycidyl ether, polypropylene glycol diglycidyl ether, trimethylolpropane triglycidyl ether, glycerol triglycidyl ether, 4-vinylcyclohexene monooxide, vinylcyclohexene dioxide, methylated vinylcyclohexene dioxide, and the like.

These diluents may be used either alone or in combination.

The curable composition according to one embodiment of the invention may be obtained by mixing the component (A), the component (B), and an optional additional component in a given ratio, and defoaming the mixture using a known method, for example.

The curable composition according to one embodiment of the invention thus obtained can produce a cured product that does not show a deterioration in transparency due to coloration even when exposed to high-energy light or subjected to a high temperature, and exhibits high adhesion.

Therefore, the curable composition according to one embodiment of the invention may suitably be used as a raw material for producing optical parts or formed articles, an adhesive, a coating agent, and the like. Since the curable composition according to one embodiment of the invention can prevent a deterioration in an optical device-securing material due to an increase in brightness of the optical device, the curable composition may suitably be used as an optical device-securing composition.

2) Cured Product

A cured product according to one embodiment of the invention is obtained by curing the curable composition according to one embodiment of the invention.

The curable composition according to one embodiment of the invention may be cured by heating the curable composition. The heating temperature when curing the curable composition is normally 100 to 200° C., and the heating time when curing the curable composition is normally 10 minutes to 20 hours, and preferably 30 minutes to 10 hours.

The cured product according to one embodiment of the invention does not show a deterioration in transparency due to coloration even when exposed to high-energy light or subjected to a high temperature, exhibits excellent transparency for a long time, and exhibits high adhesion.

Since the cured product according to one embodiment of the invention can prevent a deterioration in an optical device-securing material due to an increase in brightness of the optical device, the cured product may suitably be used as an optical device-securing material. For example, the cured product may suitably be used as a raw material for producing optical parts or formed articles, an adhesive, a coating agent, and the like.

A cured product obtained by curing the curable composition according to one embodiment of the invention exhibits high adhesion when measured by the following method, for example. Specifically, the curable composition is applied to a mirror surface of a silicon chip. The surface of the silicon chip to which the curable composition is applied is compression-bonded to an adherend, and the curable composition is cured by heating. After allowing the resulting product to stand for 30 seconds on a measurement stage of a bond tester that has been heated in advance to a given temperature (e.g., 23 or 100° C.), adhesion between the specimen and the adherend is measured while applying stress to the bonding surface in the horizontal direction (shearing direction) at a height of 50 μm above the adherend.

It is preferable that the cured product have an adhesion at 23° C. or 100° C. of 80 N/mm$^2$ or more, and more preferably 100 N/mm$^2$ or more.

Whether or not the cured product exhibits excellent transparency may be determined by measuring the light transmittance of the cured product. The light transmittance of the cured product is preferably 80% or more at a wavelength of 400 nm and 450 nm, for example.

The cured product exhibits excellent heat resistance since the cured product shows only a small change in transparency even when subjected to a high temperature. It is preferable that the cured product have a transmittance (wavelength: 400 or 450 nm) of 80% or more of the initial transmittance when allowed to stand at 150° C. for 500 hours.

3) Method for Using Curable Composition

A method for using a curable composition according to one embodiment of the invention uses the curable composition according to one embodiment of the invention as an optical device-securing composition such as an optical device adhesive or an optical device sealant.

Examples of the optical device include a light-emitting device (e.g., LED and LD), a light-receiving device, a hybrid optical device, an optical integrated circuit, and the like.

Optical Device Adhesive

The curable composition according to one embodiment of the invention may suitably be used as an optical device adhesive.

When using the curable composition according to one embodiment of the invention as an optical device adhesive, the curable composition may be applied to the bonding surface of one or both of the bonding target materials (e.g., an optical device and a substrate), for example. The bonding target materials may be compression-bonded, and the curable composition may be cured by heating to firmly bond the bonding target materials.

Examples of a material for forming the substrate to which the optical device is bonded, include glass such as soda lime glass and heat-resistant hard glass; ceramics; metals such as iron, copper, aluminum, gold, silver, platinum, chromium, titanium, alloys thereof, and stainless steel (e.g., SUS302, SUS304, SUS304L, and SUS309); synthetic resins such as polyethylene terephthalate, polybuthylene terephthalate, polyethylene naphthalate, an ethylene-vinyl acetate copolymer, polystyrene, polycarbonate, polymethylpentene, polysulfone, polyether ether ketone, polyether sulfone, polyphenylene sulfide, polyetherimide, polyimide, polyamide, an acrylic resin, a norbornene resin, a cycloolefin resin, and a glass epoxy resin; and the like.

The heating temperature when curing the curable composition is determined taking account of the curable composition and the like, but is normally 100 to 200° C. The heating time is normally 10 minutes to 20 hours, and preferably 30 minutes to 10 hours.

Optical Device Sealant

The curable composition according to one embodiment of the invention may suitably be used as an optical device sealant.

When using the curable composition according to one embodiment of the invention as an optical device sealant, the curable composition may be molded to have the desired shape to obtain a formed article in which an optical device is enclosed, for example. The formed article may be cured by heating to produce a sealed optical device.

The curable composition according to one embodiment of the invention may be formed to have the desired shape using an arbitrary method. A known molding method such as a transfer molding method or a casting method may be used.

The heating temperature when curing the curable composition is determined taking account of the curable composition and the like, but is normally 100 to 200° C. The heating time is normally 10 minutes to 20 hours, and preferably 30 minutes to 10 hours.

A sealed optical device produced by utilizing the curable composition according to one embodiment of the invention exhibits excellent transparency (i.e., does not show coloration due to heat or light), and exhibits excellent heat resistance even if the optical device has a short emission peak wavelength of 400 to 490 nm (e.g., white LED or blue LED).

EXAMPLES

The invention is further described below by way of examples and comparative examples. Note that the invention is not limited to the following examples.

Measurement of Weight Average Molecular Weight

The polystyrene-reduced weight average molecular weight (Mw) of the silane compound copolymer obtained in each production example was determined using the following apparatus under the following conditions.
Apparatus: HLC-8220 GPC (manufactured by Tosoh Corporation)
Column: Columns TSKgel GMHXL, TSKgel GMHXL, and TSKgel 12000 HXL were sequentially connected
Solvent: tetrahydrofuran
Injection amount: 80 μl
Measurement temperature: 40° C.
Flow rate: 1 ml/min
Detector: differential refractometer
Measurement of IR Spectrum The IR spectrum of the silane compound copolymer obtained in each production example was determined using the following apparatus.
Fourier transform infrared spectrophotometer ("Spectrum 100" manufactured by Perkin-Elmer)

Production Example 1

A 300 ml recovery flask was charged with 20.2 g (102 mmol) of phenyltrimethoxysilane (manufactured by Tokyo Chemical Industry Co., Ltd., hereinafter the same), 3.15 g (18 mmol) of 2-cyanoethyltrimethoxysilane (manufactured by AZmax Co., hereinafter the same), 96 ml of acetone (solvent), and 24 ml of distilled water. After the addition of 0.15 g (1.5 mmol) of phosphoric acid (manufactured by Kanto Chemical Co., Inc., hereinafter the same) (catalyst) with stirring, the mixture was stirred at room temperature for a further 16 hours.

After completion of the reaction, the reaction mixture was concentrated to 50 ml using an evaporator. After the addition of 100 ml of ethyl acetate, the mixture was neutralized with a saturated sodium hydrogen carbonate aqueous solution. After allowing the mixture to stand for a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and added dropwise to a large quantity of n-hexane to effect precipitation. The resulting precipitate was separated by decantation. The precipitate thus separated was dissolved in methyl ethyl ketone (MEK), and the solution was collected. After evaporating the solvent under reduced pressure using an evaporator, the residue was dried under vacuum to obtain 13.5 g of a silane compound copolymer (A1).

The weight average molecular weight (Mw) of the silane compound copolymer (A1) was 1900.

The IR spectrum data of the silane compound copolymer (A1) is shown below. Si-Ph: 698 $cm^{-1}$, 740 $cm^{-1}$, Si—O: 1132 $cm^{-1}$, —CN: 2259 $cm^{-1}$ Production Example 2

12.9 g of a silane compound copolymer (A2) was obtained in the same manner as in Production Example 1, except that the amount of phenyltrimethoxysilane was changed to 16.6 g (84 mmol), and the amount of 2-cyanoethyltrimethoxysilane was changed to 6.30 g (36 mmol).

The weight average molecular weight (Mw) of the silane compound copolymer (A2) was 2000.

The IR spectrum data of the silane compound copolymer (A2) is shown below. Si-Ph: 698 $cm^{-1}$, 740 $cm^{-1}$, Si—O: 1132 $cm^{-1}$, —CN: 2255 $cm^{-1}$ Production Example 3

A 300 ml recovery flask was charged with 20.2 g (102 mmol) of phenyltrimethoxysilane, 4.0 g (18 mmol) of 3-acetoxypropyltrimethoxysilane (manufactured by AZmax Co.), 60 ml of toluene (solvent), and 30 ml of distilled water. After the addition of 0.15 g (1.5 mmol) of phosphoric acid (catalyst) with stirring, the mixture was stirred at room temperature for a further 16 hours.

After completion of the reaction, 100 ml of ethyl acetate was added to the reaction mixture, and the mixture was neutralized with a saturated sodium hydrogen carbonate aqueous solution. After allowing the mixture to stand for a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and added dropwise to a large quantity of n-hexane to effect precipitation. The resulting precipitate was separated by decantation. The precipitate thus separated was dissolved in methyl ethyl ketone (MEK), and the solution was collected. After evaporating the solvent under reduced pressure using an evaporator, the residue was dried under vacuum to obtain 14.7 g of a silane compound copolymer (A3).

The weight average molecular weight (Mw) of the silane compound copolymer (A3) was 2700.

The IR spectrum data of the silane compound copolymer (A3) is shown below. Si-Ph: 699 cm$^{-1}$, 741 cm$^{-1}$, Si—O: 1132 cm$^{-1}$, —CO: 1738 cm$^{-1}$ Production Example 4

A 300 ml recovery flask was charged with 20.2 g (102 mmol) of phenyltrimethoxysilane, 3.58 g (18 mmol) of 3-chloropropyltrimethoxysilane (manufactured by Tokyo Chemical Industry Co., Ltd.), 60 ml of toluene (solvent), and 30 ml of distilled water. After the addition of 0.15 g (1.5 mmol) of phosphoric acid (catalyst) with stirring, the mixture was stirred at room temperature for a further 16 hours.

After completion of the reaction, the reaction mixture was neutralized with a saturated sodium hydrogen carbonate aqueous solution. After the addition of 100 ml of ethyl acetate, the mixture was stirred, and allowed to stand, and the organic layer was isolated preparatively. The organic layer was washed twice with distilled water, and dried over anhydrous magnesium sulfate. After separating magnesium sulfate by filtration, the filtrate was added dropwise to a large quantity of n-hexane to effect precipitation. The resulting precipitate was separated by decantation. The precipitate thus separated was dissolved in methyl ethyl ketone (MEK), and the solution was collected. After evaporating the solvent under reduced pressure using an evaporator, the residue was dried under vacuum to obtain 13.6 g of a silane compound copolymer (A4).

The weight average molecular weight (Mw) of the silane compound copolymer (A4) was 3000.

The IR spectrum data of the silane compound copolymer (A4) is shown below. Si-Ph: 700 cm$^{-1}$, 741 cm$^{-1}$, Si—O: 1132 cm$^{-1}$, —Cl: 648 cm$^{-1}$ Example 1

0.1 g of tris[3-(trimethoxysilyl)propyl]isocyanurate (manufactured by Shin-Etsu Chemical Co., Ltd., hereinafter referred to as "silane coupling agent (B1)") (silane coupling agent (B)) was added to 10 g of the silane compound copolymer (A1) obtained in Production Example 1. The mixture was sufficiently mixed and defoamed to obtain a curable composition.

Examples 2 to 27 and Comparative Examples 1 to 5

Curable compositions of Examples 2 to 27 and Comparative Examples 1 to 5 were obtained in the same manner as in Example 1, except that one of the silane compound copolymers (A1) to (A4) and the silane coupling agent (B1) and/or (B2) were used in the amounts shown in Table 1.

Note that the silane coupling agent (B2) is N,N'-bis(3-trimethoxysilylpropyl)urea (manufactured by AZmax Co.).

The adhesion, the initial transmittance, and the transmittance after heating were measured as described below using the cured products of the curable compositions obtained in Examples 1 to 27 and Comparative Examples 1 to 5, and the adhesive heat resistance, the initial transparency, and the heat resistance (transparency after heating) were evaluated.

The measurement results and the evaluation results are shown in Table 1.

Adhesion Test

Each of the curable compositions obtained in Examples 1 to 16 and Comparative Examples 1 to 5 was applied to a mirror surface of a silicon chip (2×2 mm) to a thickness of about 2 µm. The surface of the silicon chip to which the curable composition was applied was compression-bonded to an adherend (silver-plated copper sheet). The curable composition was cured by heating at 180° C. for 2 hours to prepare a specimen-bonded adherend. After allowing the specimen-bonded adherend to stand for 30 seconds on a measurement stage of a bond tester ("Series 4000" manufactured by Dage Co., Ltd.) that had been heated to a given temperature (23° C. or 100° C.), the adhesion (N/mm$^2$) (23° C. and 100° C.) between the specimen and the adherend was measured while applying stress (speed: 200 µm/s) to the bonding surface in the horizontal direction (shearing direction) at a height of 50 µm above the adherend.

Adhesive Heat Resistance

A case where the adhesion at 23° C. and the adhesion at 100° C. measured by the adhesion test were 100 N/mm$^2$ or more was evaluated as "A", a case where the adhesion at 23° C. was 100 N/mm$^2$ or more, and the adhesion at 100° C. was 80 N/mm$^2$ or more and less than 100 N/mm$^2$ was evaluated as "B", a case where the adhesion at 23° C. was 100 N/mm$^2$ or more, and the adhesion at 100° C. was 60 N/mm$^2$ or more and less than 80 N/mm$^2$ was evaluated as "C", and a case where the adhesion at 23° C. was less than 100 N/mm$^2$ was evaluated as "D".

Measurement of Initial Transmittance

Each of the curable compositions obtained in Examples 1 to 27 and Comparative Examples 1 to 5 was poured into a mold to have a length of 25 mm, a width of 20 mm, and a thickness of 1 mm, and cured by heating at 140° C. for 6 hours to prepare a specimen. The initial transmittance (%) (wavelength: 400 nm and 450 nm) of the specimen was measured using a spectrophotometer ("MPC-3100" manufactured by Shimadzu Corporation).

Initial Transparency

A case where the initial transmittance at a wavelength of 400 nm was 80% or more was evaluated as "A", a case where the initial transmittance at a wavelength of 400 nm was 70% or more and less than 80% was evaluated as "B", and a case where the initial transmittance at a wavelength of 400 nm was less than 70% was evaluated as "C".

Measurement of Transmittance after Heating

The specimen for which the initial transmittance had been measured was allowed to stand in an oven at 150° C. for 500 hours, and the transmittance (%) (wavelength: 400 nm and 450 nm) of the specimen was measured. The transmittance thus measured was taken as the transmittance after heating.

Heat Resistance (Transparency after Heating)

A case where the transmittance (after heating) at a wavelength of 400 nm was 80% or more of the initial transmittance was evaluated as "A", a case where the transmittance (after heating) at a wavelength of 400 nm was 70% or more and less than 80% of the initial transmittance was evaluated as "B", and a case where the transmittance (after heating) at a wavelength of 400 nm was less than 70% of the initial transmittance was evaluated as "C".

TABLE 1

| | Component (A) (parts by mass) | | | | Component (B) (parts by mass) | | Adhesion (N/mm²) | | Adhesive heat resistance | Initial transmittance (%) | | Initial transparency | Transmittance after heating (%) | | Heat resistance (transparency after heating) |
|---|---|---|---|---|---|---|---|---|---|---|---|---|---|---|---|
| | A1 | A2 | A3 | A4 | B1 | B2 | 23° C. | 100° C. | | 400 nm | 450 nm | | 400 nm | 450 nm | |
| Example 1 | 100 | — | — | — | 1 | — | 102.48 | 109.47 | A | 89.5 | 92.2 | A | 87.6 | 91.8 | A |
| Example 2 | 100 | — | — | — | 5 | — | 135.23 | 118.89 | A | 88.1 | 92.8 | A | 86.4 | 92.4 | A |
| Example 3 | 100 | — | — | — | 10 | — | 142.02 | 124.46 | A | 87.9 | 92.0 | A | 86.9 | 90.7 | A |
| Example 4 | 100 | — | — | — | 15 | — | 164.32 | 131.82 | A | 85.5 | 88.9 | A | 86.1 | 89.6 | A |
| Example 5 | 100 | — | — | — | — | 1 | 110.09 | 96.82 | A | 90.2 | 93.7 | A | 88.6 | 91.4 | A |
| Example 6 | 100 | — | — | — | — | 5 | 152.53 | 106.42 | A | 90.0 | 92.1 | A | 80.2 | 84.6 | A |
| Example 7 | — | 100 | — | — | 1 | — | 100.76 | 93.73 | B | 93.5 | 94.1 | A | 87.5 | 89.1 | A |
| Example 8 | — | 100 | — | — | 10 | — | 121.40 | 100.03 | A | 91.7 | 92.2 | A | 85.9 | 88.7 | A |
| Example 9 | — | — | 100 | — | 1 | — | 107.01 | 97.43 | B | 89.9 | 90.9 | A | 87.1 | 89.6 | A |
| Example 10 | — | — | 100 | — | 10 | — | 126.44 | 100.37 | A | 88.2 | 91.7 | A | 88.9 | 88.9 | A |
| Example 11 | — | — | — | 100 | 1 | — | 112.27 | 93.73 | B | 88.7 | 89.3 | A | 89.1 | 89.1 | A |
| Example 12 | — | — | — | 100 | 10 | — | 118.03 | 105.29 | A | 87.4 | 90.4 | A | 89.4 | 91.2 | A |
| Example 13 | — | — | 100 | — | — | 1 | 105.29 | 93.53 | B | 89.6 | 92.5 | A | 89.5 | 91.8 | A |
| Example 14 | — | — | 100 | — | — | 10 | 130.47 | 101.76 | A | 88.4 | 90.6 | A | 81.2 | 86.2 | A |
| Example 15 | — | — | — | 100 | — | 1 | 109.37 | 102.26 | A | 92.2 | 93.3 | A | 90.3 | 92.5 | A |
| Example 16 | — | — | — | 100 | — | 10 | 137.33 | 117.43 | A | 89.7 | 91.1 | A | 82.4 | 86.6 | A |
| Example 17 | 100 | — | — | — | 10 | 0.3 | 153.26 | 109.59 | A | 89.9 | 90.8 | A | 87.3 | 89.4 | A |
| Example 18 | 100 | — | — | — | 10 | 0.5 | 127.62 | 122.21 | A | 88.1 | 91.5 | A | 88.6 | 91.7 | A |
| Example 19 | 100 | — | — | — | 10 | 1 | 139.91 | 129.54 | A | 90.4 | 92.7 | A | 85.7 | 88.2 | A |
| Example 20 | 100 | — | — | — | 10 | 5 | 157.98 | 124.00 | A | 89.3 | 91.2 | A | 83.2 | 87.6 | A |
| Example 21 | 100 | — | — | — | 10 | 10 | 157.63 | 136.61 | A | 87.2 | 89.9 | A | 82.4 | 86.1 | A |
| Example 22 | — | 100 | — | — | 10 | 1 | 128.91 | 106.99 | A | 88.7 | 89.4 | A | 83.3 | 85.2 | A |
| Example 23 | — | 100 | — | — | 10 | 5 | 139.91 | 107.79 | A | 86.5 | 90.1 | A | 81.5 | 83.9 | A |
| Example 24 | — | — | 100 | — | 10 | 1 | 130.68 | 105.67 | A | 86.6 | 89.2 | A | 84.6 | 86.3 | A |
| Example 25 | — | — | 100 | — | 10 | 5 | 135.91 | 120.97 | A | 84.5 | 87.2 | A | 82.3 | 84.4 | A |
| Example 26 | — | — | — | 100 | 10 | 1 | 112.81 | 112.13 | A | 88.5 | 92.2 | A | 86.1 | 88.3 | A |
| Example 27 | — | — | — | 100 | 10 | 5 | 126.98 | 118.14 | A | 86.8 | 89.6 | A | 83.7 | 85.8 | A |
| Comparative Example 1 | 100 | — | — | — | 0.1 | — | 37.40 | 12.35 | D | 90.1 | 93.1 | A | 88.4 | 90.5 | A |
| Comparative Example 2 | 100 | — | — | — | 50 | — | 62.59 | 19.77 | D | 94.3 | 95.2 | A | 90.8 | 91.7 | A |
| Comparative Example 3 | 100 | — | — | — | — | — | 31.84 | 8.99 | D | 90.5 | 93.3 | A | 89.8 | 90.6 | A |
| Comparative Example 4 | — | — | 100 | — | — | — | 26.47 | 6.12 | D | 91.3 | 93.0 | A | 90.0 | 91.7 | A |
| Comparative Example 5 | — | — | — | 100 | — | — | 25.33 | 5.19 | D | 91.8 | 92.2 | A | 89.2 | 90.8 | A |

As shown in Table 1, the cured products of the curable compositions obtained in Examples 1 to 27 exhibited excellent adhesion and excellent adhesive heat resistance. The cured products of the curable compositions obtained in Examples 1 to 27 also exhibited high initial transmittance and high transmittance after heating (wavelength: 400 nm and 450 nm), and exhibited excellent initial transparency and excellent heat resistance (transparency after heating).

On the other hand, the cured product of the curable composition obtained in Comparative Example 1 in which the amount of the component (B) was small, the cured product of the curable composition obtained in Comparative Example 2 in which the amount of the component (B) was large, and the cured products of the curable compositions obtained in Comparative Examples 3 to 5 in which the component (B) was not used, exhibited poor adhesion and adhesive heat resistance.

The invention claimed is:

1. A curable composition comprising a component (A) and a component (B) in a mass ratio (component (A):component (B)) of 100:1 to 100:20,
the component (A) being a silane compound copolymer that is represented by a formula (a-1), and has a weight average molecular weight of 800 to 30,000,

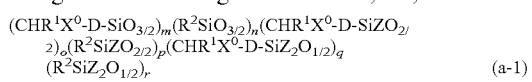

$(CHR^1X^0\text{-}D\text{-}SiO_{3/2})_m(R^2SiO_{3/2})_n(CHR^1X^0\text{-}D\text{-}SiZO_{2/2})_o(R^2SiZO_{2/2})_p(CHR^1X^0\text{-}D\text{-}SiZ_2O_{1/2})_q(R^2SiZ_2O_{1/2})_r$ (a-1)

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, Z is a hydroxyl group, an alkoxy group having 1 to 10 carbon atoms, or a halogen atom, m and n are independently a positive integer, and o, p, q, and r are independently 0 or a positive integer, and
the component (B) being a 1,3,5-N-tris(trialkoxysilyla-
lkyl) isocyanurate represented by a formula (b-3), or an
N,N'-bis(trialkoxysilylalkyl)urea represented by a for-
mula (b-4),

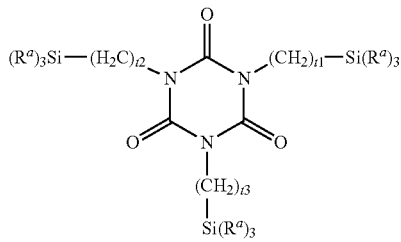
(b-3)

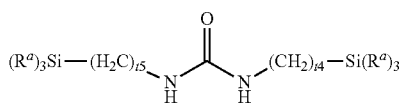
(b-4)

wherein each of $R^a$ is an alkoxy group having 1 to 6 carbon atoms, provided that a plurality of $R^a$ are either identical or different, and t1 to t5 are independently an integer from 1 to 10.

2. The curable composition according to claim 1, wherein m:n=60:40 to 5:95.

3. A curable composition comprising a component (A') and a component (B) in a mass ratio (component (A'):component (B)) of 100:1 to 100:20,
the component (A') being a silane compound copolymer that is produced by condensing a silane compound mixture, and has a weight average molecular weight of 800 to 30,000, the silane compound mixture including at least one silane compound (1) represented by a formula (1), and at least one silane compound (2) represented by a formula (2), $$R^1\text{---}CH(X^0)\text{-}D\text{-}Si(OR^3)_u(X^1)_{3-u} \qquad (1)$$

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^3$ is an alkyl group having 1 to 10 carbon atoms, $X^1$ is a halogen atom, and u is an integer from 0 to 3, $$R^2Si(OR^4)_v(X^2)_{3-v} \qquad (2)$$

wherein $R^2$ is an alkyl group having 1 to 20 carbon atoms or a substituted or unsubstituted phenyl group, $R^4$ is an alkyl group having 1 to 10 carbon atoms, $X^2$ is a halogen atom, and v is an integer from 0 to 3, and
the component (B) being a 1,3,5-N-tris(trialkoxysilyla-
lkyl) isocyanurate represented by a formula (b-3), or an
N,N'-bis(trialkoxysilylalkyl)urea represented by a for-
mula (b-4),

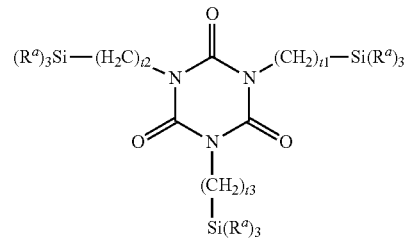
(b-3)

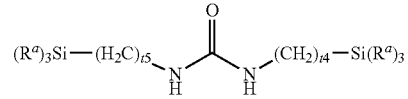
(b-4)

wherein each of $R^a$ is an alkoxy group having 1 to 6 carbon atoms, provided that a plurality of $R^a$ are either identical or different, and t1 to t5 are independently an integer from 1 to 10.

4. The curable composition according to claim 3, wherein the component (A') is a silane compound copolymer obtained by condensing the silane compound (1) and the silane compound (2) in a molar ratio (silane compound (1):silane compound (2)) of 60:40 to 5:95.

5. A curable composition comprising a component (A") and a component (B) in a mass ratio (component (A"):component (B)) of 100:1 to 100:20,
the component (A") being a silane compound copolymer that includes a repeating unit represented by a formula (i) and a repeating unit represented by a formula (ii), or the repeating unit represented by the formula (i) and a repeating unit represented by a formula (iii), or the repeating unit represented by the formula (ii) and the repeating unit represented by the formula (iii), or the repeating unit represented by the formula (i), the repeating unit represented by the formula (ii), and the repeating unit represented by the formula (iii), and has a weight average molecular weight of 800 to 30,000,

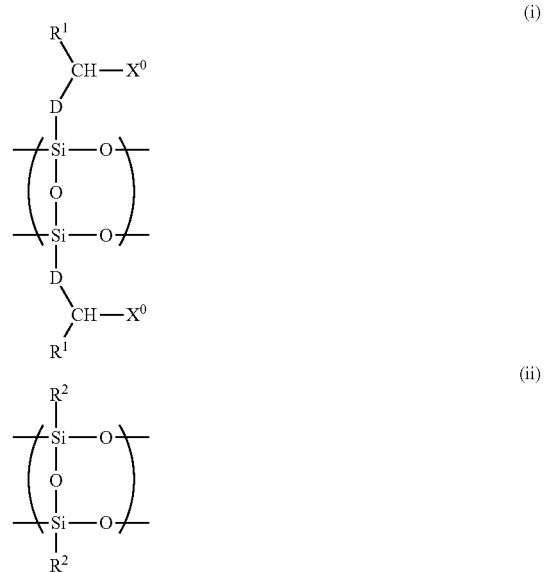

-continued

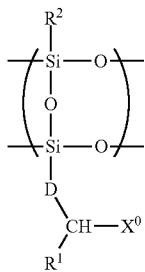
(iii)

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, and $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, and the component (B) being a 1,3,5-N-tris(trialkoxysilylalkyl) isocyanurate represented by a formula (b-3), or an N,N'-bis(trialkoxysilylalkyl)urea represented by a formula (b-4),

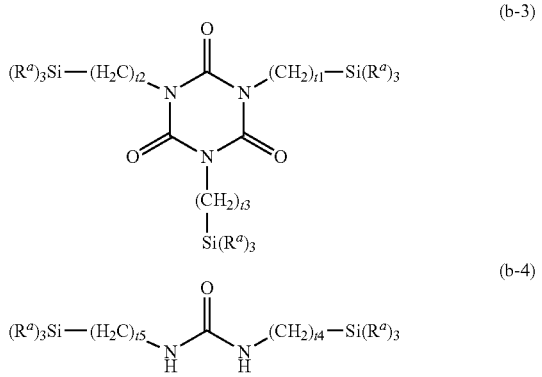
(b-3)

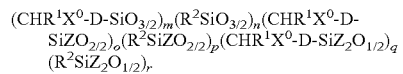
(b-4)

wherein each of $R^a$ is an alkoxy group having 1 to 6 carbon atoms, provided that a plurality of $R^a$ are either identical or different, and t1 to t5 are independently an integer from 1 to 10.

6. The curable composition according to claim 5, wherein the component (A″) is a polymer that includes a group represented by $R^1$—CH($X^0$)-D- and $R^2$ in a molar ratio (($R^1$—CH($X^0$-D-):($R^2$)) of 60:40 to 5:95.

7. The curable composition according to claim 1, the curable composition being an optical device-securing composition.

8. A cured product obtained by curing the curable composition according to claim 1.

9. The cured product according to claim 8, the cured product being an optical device-securing material.

10. A method for using the curable composition according to claim 1 as an optical device-securing adhesive, said method comprising applying the curable composition to a bonding surface of an optical device.

11. A method for using the curable composition according to claim 1 as an optical device-securing sealant, said method comprising the curable composition being molded to have the desired shape to obtain a formed article in which an optical device is enclosed, and the formed article being cured by heating to produce a sealed optical device.

12. The curable composition according to claim 3, the curable composition being an optical device-securing composition.

13. The curable composition according to claim 5 the curable composition being an optical device-securing composition.

14. A cured product obtained by curing the curable composition according to claim 3.

15. A cured product obtained by curing the curable composition according to claim 5.

16. A method for using the curable composition according to claim 3 as an optical device-securing adhesive, said method comprising applying the curable composition to a bonding surface of an optical device.

17. A method for using the curable composition according to claim 5 as an optical device-securing adhesive, said method comprising applying the curable composition to a bonding surface of an optical device.

18. A method for using the curable composition according to claim 3 as an optical device-securing sealant, said method comprising the curable composition being molded to have the desired shape to obtain a formed article in which an optical device is enclosed, and the formed article being cured by heating to produce a sealed optical device.

19. A method for using the curable composition according to claim 5 as an optical device-securing sealant, said method comprising the curable composition being molded to have the desired shape to obtain a formed article in which an optical device is enclosed, and the formed article being cured by heating to produce a sealed optical device.

20. The cured product according to claim 14, the cured product being an optical device-securing material.

21. A curable composition consisting of a component (A) and a component (B) in a mass ratio (component (A):component (B)) of 100:1 to 100:20, the component (A) being a silane compound copolymer that is represented by a formula (a-1), and has a weight average molecular weight of 800 to 30,000, $$(CHR^1X^0\text{-}D\text{-}SiO_{3/2})_m(R^2SiO_{3/2})_n(CHR^1X^0\text{-}D\text{-}SiZO_{2/2})_o(R^2SiZO_{2/2})_p(CHR^1X^0\text{-}D\text{-}SiZ_2O_{1/2})_q(R^2SiZ_2O_{1/2})_r \quad \text{(a-1)}$$

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^2$ is a substituted or unsubstituted alkyl group having 1 to 20 carbon atoms (excluding a case where the alkyl group is substituted with a halogen atom, a cyano group, or the group represented by OG), or a substituted or unsubstituted phenyl group, Z is a hydroxyl group, an alkoxy group having 1 to 10 carbon atoms, or a halogen atom, m and n are independently a positive integer, and o, p, q, and r are independently 0 or a positive integer, and the component (B) being a 1,3,5-N-tris(trialkoxysilylalkyl) isocyanurate represented by a formula (b-3), or an N,N'-bis(trialkoxysilylalkyl)urea represented by a formula (b-4),

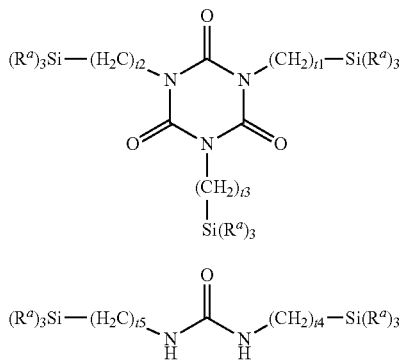

wherein each of $R^a$ is an alkoxy group having 1 to 6 carbon atoms, provided that a plurality of $R^a$ are either identical or different, and t1 to t5 are independently an integer from 1 to 10.

22. The curable composition according to claim 1, comprising component (A), component (B), and other components selected from the group consisting of an anti-oxidant, a UV absorber, a photo-stabilizer, and a diluent,
the other components being included in an amount of more than 0 mass % and 20 mass % or less of the amount of component (A).

23. A curable composition consisting of a component (A') and a component (B) in a mass ratio (component (A'):component (B)) of 100:1 to 100:20,
the component (A') being a silane compound copolymer that is produced by condensing a silane compound mixture, and has a weight average molecular weight of 800 to 30,000, the silane compound mixture including at least one silane compound (1) represented by a formula (1), and at least one silane compound (2) represented by a formula (2), $$R^1-CH(X^0)-D-Si(OR^3)_u(X^1)_{3-u} \quad (1)$$

wherein $R^1$ is a hydrogen atom or an alkyl group having 1 to 6 carbon atoms, $X^0$ is a halogen atom, a cyano group, or a group represented by OG (wherein G is a protecting group for a hydroxyl group), D is a single bond or a substituted or unsubstituted divalent organic group having 1 to 20 carbon atoms, $R^3$ is an alkyl group having 1 to 10 carbon atoms, $X^1$ is a halogen atom, and u is an integer from 0 to 3, $$R^2Si(OR^4)_v(X^2)_{3-v} \quad (2)$$

wherein $R^2$ is an alkyl group having 1 to 20 carbon atoms or a substituted or unsubstituted phenyl group, $R^4$ is an alkyl group having 1 to 10 carbon atoms, $X^2$ is a halogen atom, and v is an integer from 0 to 3, and the component (B) being a 1,3,5-N-tris(trialkoxysilylalkyl) isocyanurate represented by a formula (b-3), or an N,N'-bis(trialkoxysilylalkyl)urea represented by a formula (b-4),

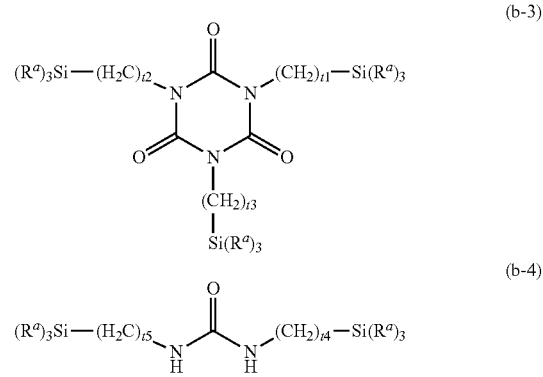

wherein each of $R^a$ is an alkoxy group having 1 to 6 carbon atoms, provided that a plurality of $R^a$ are either identical or different, and t1 to t5 are independently an integer from 1 to 10.

24. The curable composition according to claim 3, comprising component (A'), component (B), and other components selected from the group consisting of an anti-oxidant, a UV absorber, a photo-stabilizer, and a diluent,
the other components being included in an amount of more than 0 mass % and 20 mass % or less of the amount of component (A').

* * * * *